United States Patent [19]

Gershenson et al.

[11] Patent Number: 4,567,438
[45] Date of Patent: Jan. 28, 1986

[54] SQUID CANISTER WITH CONICAL COUPLING CAVITY

[75] Inventors: Meir Gershenson; Mark F. Sweeny, both of St. Paul; Dennis D. Long, Pine City; David L. Fleming, Edine, all of Minn.

[73] Assignee: Sperry Corporation, New York, N.Y.

[21] Appl. No.: 482,093

[22] Filed: Apr. 4, 1983

[51] Int. Cl.[4] .................. G01R 33/02; H03K 3/38
[52] U.S. Cl. .................................. 324/248; 307/306
[58] Field of Search .................. 324/248; 307/306; 357/5; 331/107 S; 335/216

[56] References Cited

U.S. PATENT DOCUMENTS 4,403,189  9/1983  Simmonds .................. 324/248

Primary Examiner—Gerard R. Strecker
Assistant Examiner—Walter E. Snow
Attorney, Agent, or Firm—William C. Fuess; Glenn W. Bowen

[57] ABSTRACT

A type of Superconducting Quantum Interference Device (SQUID) requires that relatively large, circular, toroidally wound wire coils within a first cavity of a superconducting canister should be inductively coupled to a relatively small SQUID created as an annular ring plus Josephson junctions upon a substrate within a second cavity of the superconducting canister. The required inductive coupling is through a dielectric filled cavity called a coupling cavity which is conical in the shape of a dunce's cap. The conically shaped coupling cavity within the superconducting canister minimizes the parasitic stray inductance which is coupled to the SQUID, and thusly improves the noise performance of the SQUID.

5 Claims, 9 Drawing Figures

SQUID CANISTER WITH CONICAL COUPLING CAVITY

BACKGROUND OF THE INVENTION

The present invention generally relates to Superconducting Quantum Interference Devices (SQUIDS) and to a particular SQUID type called a HYBRID SQUID TM. The present invention particularly relates to the geometry of the construction of conical coupling cavities within a superconducting canister holding a circular, toroidally wound, input coil, which coil is inductively coupled to a SQUID which consists of Josephson junctions upon a substrate.

The prior art to the toroidal canister with a conical cavity of the present invention is a toroidal canister with a non-conical cavity utilized in the HYBRID SQUID TM (direct current and radio frequency types), which is the trademark and commercial offering of S.H.E. Corporation, 4174 Sorrento Valley Boulevard, San Diego, Calif. 92121. Specifically, the prior art structure teaches the inductive coupling of large volume (large radius) circular toroidally wound input coils to a small SQUID upon a chip substrate via an inductive coupling cavity which is not direct and straight, but which cavity within the toroidal superconducting canister actually undergoes a right angle bend.

Although possibly easier of being machined in superconducting materials such as niobium and niobium titanium (which materials present difficulties to precision machining), the prior art canister is not possessed of the optimum coupling cavity geometry for keeping those stray inductances arising from the coupling of a small radius SQUID to a large radius coil (the toroidally wound input coil) optimally small. It is desired that the stray inductance coupled to the SQUID should be minimized in order to improve the noise performance of the SQUID.

SUMMARY OF THE INVENTION

Early practical SQUID sensors have used point contact junctions. Ultimately, all thin film SQUIDS are desirable to permit integration of superconductive electronic ciruitry. The word "HYBRID" applied to a SQUID is the trademark of S.H.E. Corporation, San Diego, Calif. in reference to a transition technology between SQUIDS using point contact junctions and all thin film devices. Within a HYBRID SQUID TM, a small SQUID containing Josephson junctions is created upon a chip substrate. When created in thin flim technology, this SQUID has, in the Josephson junctions, controlled and stable properties as compared to point contacts. When the input and output coils to such SQUID are not created, as by deposition in thin film technology, upon the same substrate, then such input and output coils are physically large compared to the SQUID and are toroidally wound of wire. The HYBRID SQUID TM holds such toroidally wound wire coils in toroidal cavities of a superconducting canister. The larger input and output coils are inductively coupled to the small SQUID by a coupling cavity containing a dielectric within such superconducting canister, which cavity has a three dimensional shape.

The primary first aspect of the present invention is that that cavity within a superconducting canister which couples the toroidally wound input and output coils (also contained in cavities within the superconducting canister) to a SQUID upon a chip substrate (as contained in a cavity within the superconducting canister) should be a conical in shape. A conical cavity has three dimensional shape of a dunce's cap. The inner shell of such conical cavity, (the lining of the dunce's cap) at the truncation of such conical cavity at a circular section just below the vertex, essentially subtends the very very small inner circumference of the SQUID, which SQUID is deposited in thin film upon a substrate in the shape of an annulus ring (containing two Josephson junctions). The outer shell of such conical cavity (the outside of te dunce's cap), at the truncation of such conical cavity at a circular conical section just below the vertex, essentially subtends the very small outer circumference of the thin film SQUID in the shape of an annulus ring. Meanwhile the circumference of the base of the conical cavity essentially subtends the large circular, toroidally wound, input coil. Such a conically shaped cavity minimizes the stray inductance which is coupled to the SQUID loop, and thereby improves the noise figure of merit in the operation of the SQUID.

It is a further, subordinate, second aspect of the present invention that a conically shaped coupling cavity within the superconducting canister of a HYBRID SQUID TM should be employed to inductively couple a SQUID loop upon a substrate to a toroidally wound input and output coils regardless of whether (1) a toroidally wound input coil should occupy one cavity and a toroidally wound output coil should occupy another separate cavity isolated by superconductor from coupling magnetic flux to said one cavity, or (2) a toroidally wound output coil should occupy the same cavity within the superconducting canister as the toroidally wound input coil (thusly being coupled in magnetic flux) or, (3) a toroidally wound output coil should be within a separate cavity within the superconducting canister to that separate cavity within which is located the toroidally wound input coil wherein both cavities are coupled by magnetic flux in either. In other words, it is the subordinate second aspect of the present invention that the utility of a conically shaped coupling cavity should not be limited by the cross-sections (e.g., circular or square), or the separate numbers of toroidally shaped cavities holding toroidally wound coils (e.g., input or output coils), or by the magnetic flux coupling or isolation of such cavities, to which such conically shaped coupling cavity will provide optimal inductive coupling.

It is the general third aspect of the present invention that the three dimensional cavity within a superconducting solid which optimally (with the least stray inductance) provides inductive coupling between inductive elements (such as SQUID loops and toroidal coils) within other cavities of such superconducting solid is a three dimensional cavity of conical shape, or of truncated conical shape. This third aspect is not limited to HYBRID SQUIDS TM, but rather presents a generalized structure for a dielectric filled cavity by which anything round should be inductively coupled to anything else round within respective separate cavities of a superconducting solid. This generalized structure for a dielectric filled cavity is the conical, or truncated conical, structure with the smaller round object subtending a circular cross section of the conical cavity closer to the apex of the cone while the larger round object subtends the circular circumference of the base of the conical cavity. If both round objects inductively connected by the cavity are of equal diameter, then the cavity assumes the shape of a cone with a vertex at infinity, or the cavity is cylindrical. A cylindrical cavity has the three dimensional shape of a hollow pipe, or tube.

BRIEF DESCRIPTION OF THE DRAWINGS

FIG. 1b shows the periodic output voltage as a function of input magnetic flux exhibited by the prior art D.C. SQUID of FIG. 1a.

DESCRIPTION OF THE PREFERRED EMBODIMENT

Figure 1A:
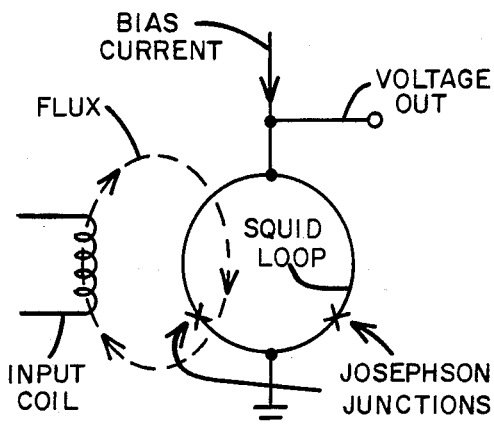
FIG. 1a shows the diagrammatic representation of a prior art d.c. SQUID.
Figure 1B:
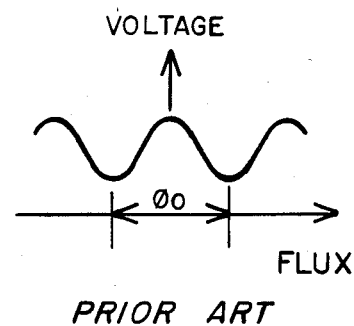

A simple prior art D.C. SQUID is shown in FIG. 1. It consists of two Josephson junctions in a superconducting loop. A bias current is applied to the SQUID and the voltage across the SQUID is then a periodic function of the flux through the SQUID loop. This periodic voltage, shown in prior art FIG. 1b, results from the interference of the wave functions representing the superconducting order parameter. The flux period is small and can be electronically subdivided, making SQUIDS very sensitive to fields or currents in the input coil. In fact, the flux period $\Phi_o$ equals $2 \times 10^{-15}$ Wb, equals 2 amp nano-Henry, equals $2 \times 10^{-7}$ gauss/cm$^2$.

The expression HYBRID SQUID TM is the trademark of S.H.E. Corporation, 4174 Sorrento Boulevard, San Diego, Calif. 92121. The HYBRID SQUID TM, offered in both d.c. and rf biased versions, is a transition technology between SQUIDS using point contact junctions and all thin film SQUID devices. Thin film Josephson junctions in a SQUID upon a substrate are combined with toroidally wound input and output coils within a superconducting canister. A large toroidally wound coil within the canister provides effective coupling of the input, while the thin film Josephson junctions have controlled and stable properties compared to point contacts.

The pictorial representation of the physical structure of a HYBRID SQUID TM, derived from the published drawing of the S.H.E. Corporation, San Diego, is shown as prior art in FIG. 2. The SQUID is created by thin film deposition on the SUBSTRATE WITH JOSEPHSON JUNCTIONS, which is located within a first cavity within the SUPERCONDUCTING CANISTER. The SQUID within this first cavity is inductively coupled to an input SECOND TOROIDAL COIL within a second cavity, which is also inductively coupled to an output FIRST TOROIDAL COIL within a third cavity by a COUPLING CAVITY such is of paramount interest to the present invention. Note that this COUPLING CAVITY undergoes a right angle bend, and is not the shortest path between the SQUID loop upon the SUBSTRATE WITH JOSEPHSON JUNCTIONS and either the SECOND TOROIDAL COIL or the FIRST TOROIDAL COIL.

Figure 2:
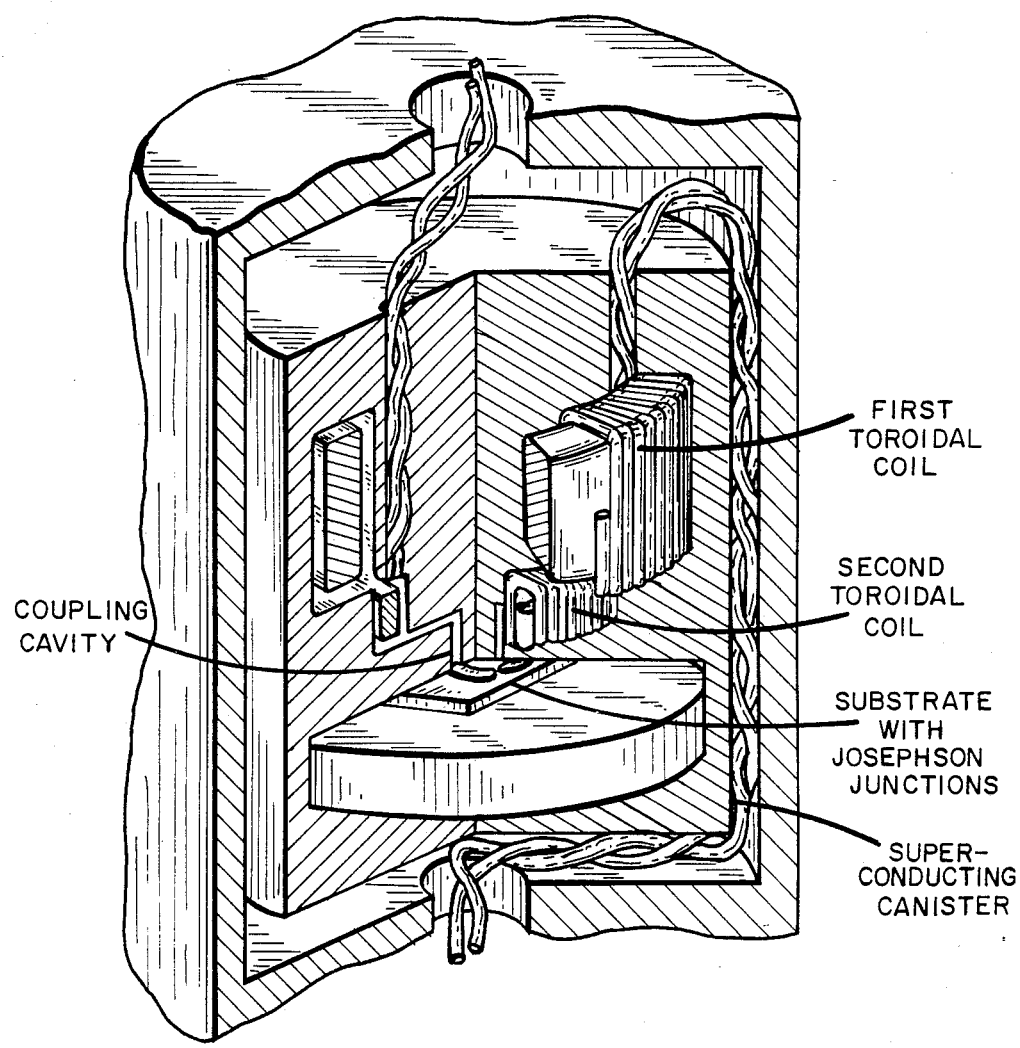
FIG. 2 shows a pictorial representation of the prior art physical structure of a HYBRID SQUID TM manufactured by S.H.E. Corporation, San Diego, Calif.
Figure 3:
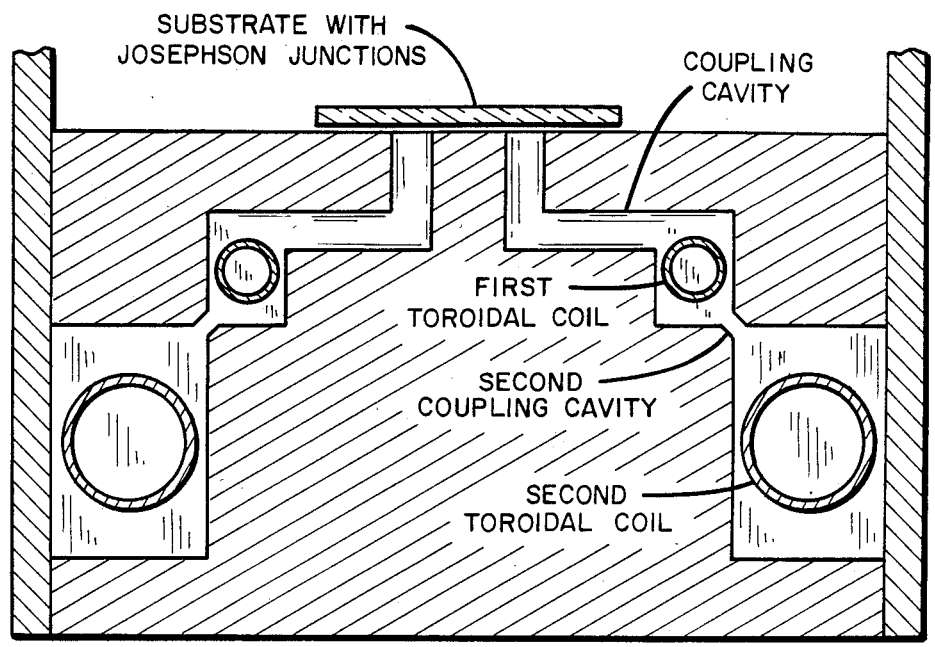
FIG. 3 shows a cross sectional view of a prior art HYBRID SQUID TM, including a prior art COUPLING CAVITY.
Figure 4:
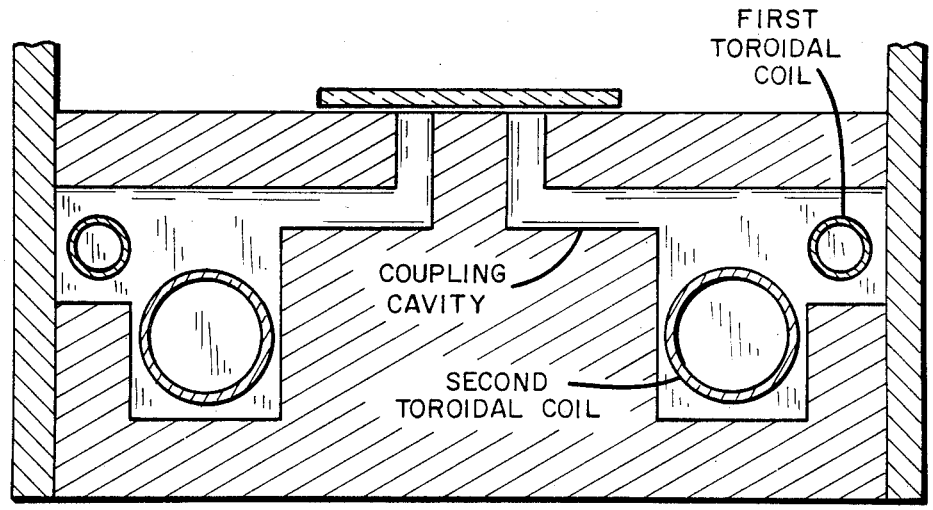
FIG. 4 shows a cross sectional view of an alternative prior art HYBRID SQUID TM to that shown in FIG. 3, including a prior art COUPLING CAVITY.

The cross sectional view of the COUPLING CAVITY, the SUBSTRATE WITH JOSEPHSON JUNCTIONS, the FIRST TOROIDAL COIL, and the SECOND TOROIDAL COIL diagrammatically seen in FIG. 2 is shown in FIG. 3. The FIRST TOROIDAL COIL is inductively communicative with said SECOND TOROIDAL COIL through a line-of-sight SECOND COUPLING CAVITY. An alternative prior art embodiment wherein both the FIRST TOROIDAL COIL and the SECOND TOROIDAL COIL occupy the same cavity is shown in FIG. 4. Alternative arrangements of the coils such as the coaxial toroidal coils (shown in conjunction with the present invention in FIG. 5) and coils located in separate cavities wherein the magnetic flux of each is shielded by a superconducting barrier from the other (as is shown in conjunction with the present invention in FIG. 6) are possible. The pertinent showing of FIG. 3 and FIG. 4 is that the prior art coupling cavity is not conically shaped.

In order to understand the superior function of the present invention of a conically shaped coupling cavity it is fundamentally necessary to understand the electrical characterization of a SQUID. A principal electrical model for a SQUID is called the RSJ model and is discussed by W. C. Steward in Appl. Phys. Lett. 12, 277 (1968) and by D. E. McCumber in J. Appl. Phys. 39, 3113 (1968). A number of parameters are used to characterize SQUID behavior. The RSJ model treats each junction as an ideal Josephson element, $I_o$, in parallel with a resistive shunt, R, and a capacitance, C. The SQUID has an inductance, L. The following expressions list a number of criteria these parameters must satisfy for the SQUID to function properly. Beyond these criteria, the primary figure of merit is SQUID noise, as it determines the detection limit of the SQUID.

| Eq. (1) | $\frac{2\pi}{\Phi_o} I_o RRC \leq 1$ | In order to form Non-Hysteretic Junctions |
|---|---|---|
| Eq. (2) | $\frac{I_o \Phi_o}{2\pi} >> kT\ I_o > .2\ \mu a$ | In order that the Josephson Junction stay locked |
| Eq. (3) | $\frac{\Phi_o^2}{L} > 4kT\ L < 2nH$ | In order that the SQUID stay locked |
| Eq. (4) | $\frac{2LI_o}{\Phi_o} \approx 1$ | So that coupled energy is evenly distributed between loop and junction |

The present invention concerns the reduction of SQUID noise. SQUID noise is, at this time, incompletely understood. A white noise region above 1 Hz. and a 1/f noise region below 1 Hz. are observed. See FIG. 8. The white noise is well explained by Nyquist noise in the junction resistance in the article by C. D. Teche and J. Clark in J. Low Temp. Phys. 29, 301 (1977). The 1/f noise mechanism is still unclear but may be due to fluctuations in the juction conductance. A pertinent article is by C. T. Rogers and R. A. Buhrman in IEEE Trans. on Mag., 1982 Appl. Superconductivity Conf. Issue. The optimization of SQUID design for minimum noise depends not only upon the frequency range of interest but also upon input circuit characteristics; tuned or untuned, resistive or superconductive, etc.

The expression of noise energy per hertz $$\epsilon \simeq 8kT \sqrt{\pi LC} \qquad \text{Eq. (5)}$$

has been found to be a useful criteria for proscribing improved noise performance. The expression dictates the build of a low inductance SQUID with low capacitance. However the inductance of a SQUID must be large enough to couple a signal to the SQUID. Additionally, the inductance and capacitance are not independent. Equation (4) constrains the inductance and critical current. Critical currents are a stronger function of thickness than capacitance, so the optimum SQUID design involves making as small a junction as possible with the technology used (reduced C), then making the junction thin enough to obtain $I_o$ as large as is required for an L as small as can be reasonably coupled to. Stray inductances on the junction chip limit reasonable SQUID inductances to the range of 100 pH to 500 pH.

Figure 5:
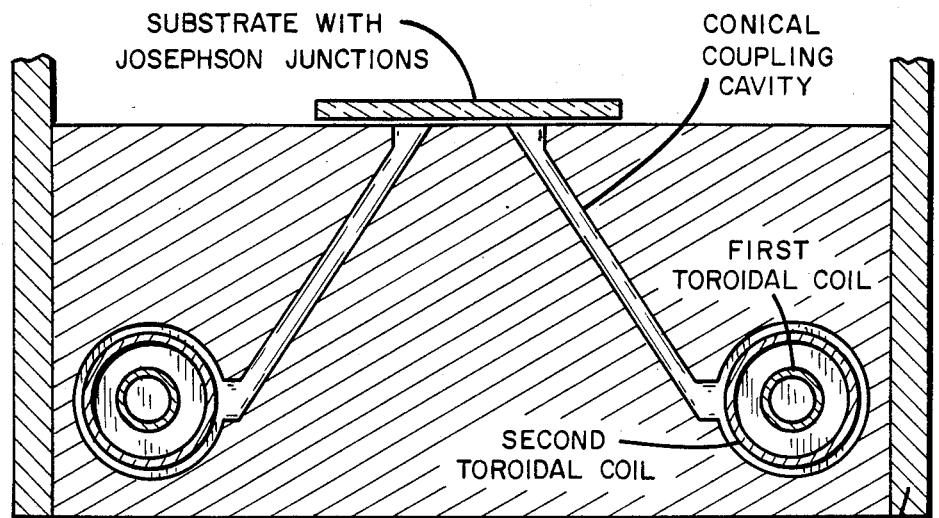
FIG. 5 shows a cross section view of the present invention of a conical coupling cavity within a superconducting cylinder.

The present invention of a conical coupling cavity within a superconducting cylinder is shown in cross sectional view in FIG. 5. The toroidal structure of the FIRST TOROIDAL COIL and the SECOND TOROIDAL COIL are preserved, and these coils are made coaxial within the same cavity. The SQUID consists of a structure in the shape of an annulus ring incorporating Josephson junctions which are deposited as thin film structures on the SUBSTRATE WITH JOSEPHSON JUNCTIONS held within a first cavity. The SQUID is inductively coupled by the CONICAL COUPLING CAVITY containing a dielectric to the input SECOND TOROIDAL COIL and to the output FIRST TOROIDAL COIL held in a toroidal second cavity. All cavities are completely contained within a SUPERCONDUCTING CANISTER.

The reason for the conical structure of the coupling cavity of the present invention is as follows. The inductance of a toroidal structure is given by $$L = \frac{\mu_o}{2\pi} \int \frac{dA}{r} \qquad \text{Eq. (6)}$$

where dA is an area element at a radius r. For effective coupling, the input coil should fill the cavity, other areas being minimized—particularly those at small radii. The cavity needs to reach a small cross sectional radius to subtend and inductively couple to the SQUID on the wafer, and needs to have a large cross sectional radius to subtend and inductively couple to the input coil. The conical coupling cavity optimally meets these requirements in a form that can be machined and fit within close tolerances. Parasitic inductance, especially at short distance (r in Eq. 6) to the SQUID is minimized. The preferred embodiment canister is machined from either niobium or niobium titanium.

The electrical path of a HYBRID SQUID ™ is as follows. One Josephson junction is electromagnetically coupled (predominantly) through the outside circumference of that annulus ring which, along with the two Josephson junctions, is the SQUID to the outer shell of the conical cavity (the outside of the dunce's cap). This outside of the conical cavity is superconducting along with the canister, and connectedly proceeds around the carvity(ies) of the toroidally wound coil(s) and along the superconducting inner shell of the conical cavity (the lining of the dunce's cap). This inner shell is electromagnetically coupled (predominantly) through the small inside circumference of that same annulus ring which, along with the two Josephson junctions, is the SQUID to the other Josephson jucntion. The electromagnetic coupling to the annulus ring SQUID may be analogized to a coaxial connector (e.g., a BNC connector) with coupling being made to both the center conductor and the circumferential outer shield. Continuing with the analogy of the coaxial connector, the coupling cavity can thusly be analogized to be the "leads" by which the input coil is inductively coupled to the coaxial connector. By analogy, it is discernable that the conical coupling cavity represents the shortest and most direct form of such "leads".

Figure 6:
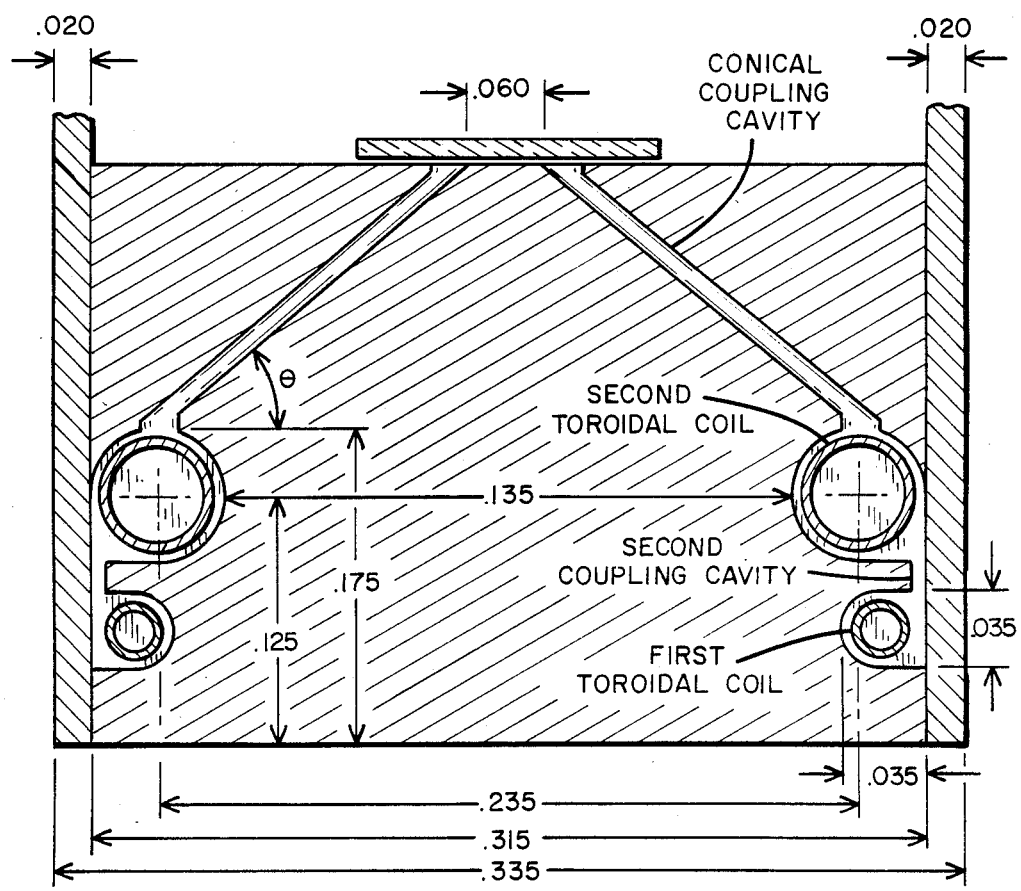
FIG. 6 shows a cross sectional view, with selective dimensions in inches, of a superconducting cylinder with plural cavities including the conical shaped coupling cavity of the present invention.

An alternative embodiment of the present invention of a conical coupling cavity is shown, along with certain relevant dimensions expressed in inches, in FIG. 6. The round circumference of the base of the conical coupling cavity may be observed to contact the cavity in which the SECOND TOROIDAL COIL is located at a slightly different location upon the wall of such cavity. The FIRST TOROIDAL COIL is within a separate cavity from the SECOND TOROIDAL COIL, and is inductively communicative with said SECOND TOROIDAL COIL only through a SECOND COUPLING CAVITY which is not line-of-sight between the coils, and which thusly establishes a superconducting barrier (the solid superconducting canister) to most of the inductive communication (via magnetic flux) between the two coils. The purposes of alternative arrangements of toroidal coils within one or more cavities as shown in FIG. 4 through FIG. 6 are not pertinent to the present invention, the main point simply being that a conical shaped coupling cavity is optimal for inductive communication with (and between although such is not the variant illustrated in FIG. 6) all toroidal coils.

Figure 7:
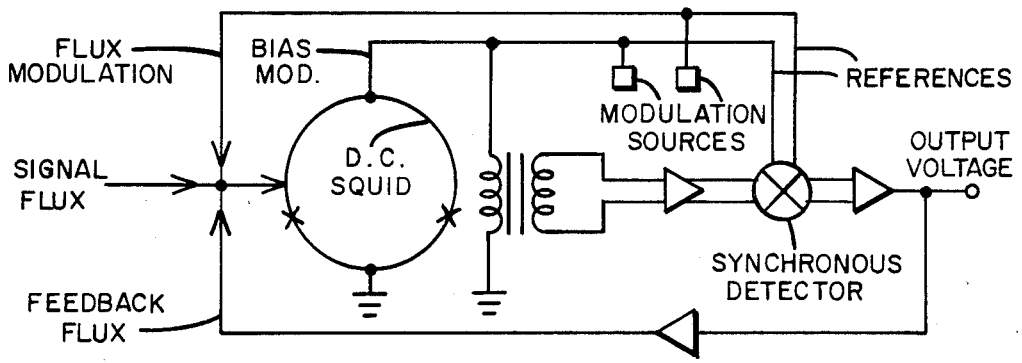
FIG. 7 shows a prior art schematic of a typical system for operation of a D.C. SQUID in a flux locked loop.

Noise measurements of hybrid D. C. SQUIDS have been made with the SQUIDS operated in a flux locked loop. A schematic of the prior art system used is shown in FIG. 7. The use of a flux locked feedback system gives a linear flux to voltage response. The application of a $\pm\Phi_o/4$ flux modulation at 110 kHz and a $\pm I_B$ bias current modulation at 500 kHz has two benefits. First, it allows the use of transformer coupling to impedance match the SQUID ($\sim 1\Omega$) to the room temperature amplifier. Second, phase sensitive detection eliminates some sources of noise.

Figure 8:
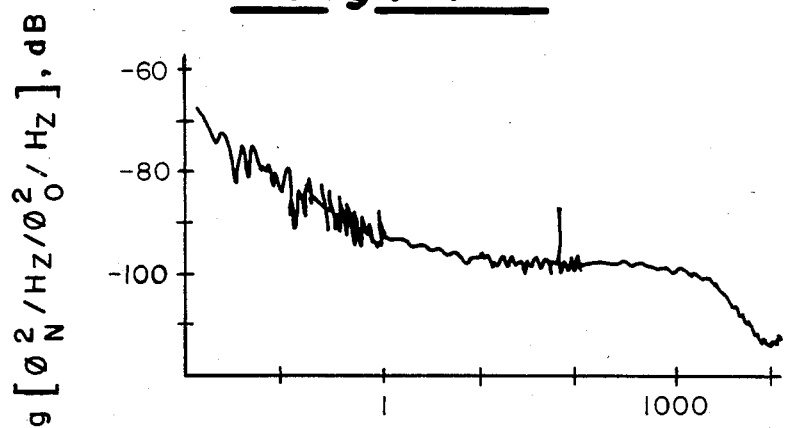
FIG. 8 shows the noise spectrum of a D.C. HYBRID SQUID incorporating the conical coupling cavity of the present invention.

FIG. 8 shows a typical noise spectrum of D. C. HYBRID SQUID ™ incorporating a conical coupling cavity when operated as described. Plotted is the flux noise power relative to a $\Phi_o^2/Hz$ versus frequency. The white noise above 1 Hz., and 1/f noise below 1 Hz., regions are clearly evident. The high frequency roll off is from the measurement system. The data was taken using a Hewlett Packard 5420 Digital Signal Analyzer. The $-100$ dB white noise level translates to $10^{-5}\Phi_o/\sqrt{Hz}$ flux noise, or $10^{-30}$ joules/Hz noise energy, in the 200 pH estimated inductance for the SQUID.

Since the noise spectrum of a SQUID is a funcion of the thin film junction technology as well as of the coupling coils and the superconducting canister including the conical coupling cavity, this specification cannot be considered a complete disclosure on how to make a D.C. HYBRID SQUID of the performance range described in the previous paragraph. What is taught is, however, that the white noise (above 1 Hz) part of that noise spectrum shown in FIG. 8 will be undesirably higher if the coupling activity within the superconducting canister is not of the optimal conical shape.

Alternative embodiments and variations of the conical coupling cavity taught in the present specification may suggest themselves to those of skill in the art upon reading of the above description. The present invention of a conical coupling cavity is not limited to the inductive coupling of parts of a HYBRID SQUID ™, but is generally useful for inductively coupling substantially circular structures, or items, of different sizes within a superconducting solid. Therefore the following claims should be interpreted to include those equivalents which are apparent from the above description.

What is claimed is:

1. A substantially solid superconducting canister holding within a first cavity a first circular electrical item of small circumference, and holding within a second cavity a circular second electrical item of circumference large relative to said small circumference of said first circular electrical item, and providing via a dielectric-filled coupling cavity between said first cavity and said second cavity an electromagnetically inductive intercommunication between said first circular electrical item and said second circular electrical item characterized in that:
   said dielectric-filled coupling cavity is substantially of conical shape, meaning being of the three dimensional shape of a dunce's cap, wherein the vertex of said cavity of conical shape, or the circular cross section of said cavity of conical shape as truncated near said vertex, substantially subtends said first electrical item of small circumference, and wherein the circular base of said cavity of conical shape substantially subtends said second electrical item of circumference large relative to said small circumference of said first circular electrical item;
   whereby the areas of said coupling cavity at any distance to either of said circular electrical items are minimized by said conical shape.

2. The superconducting canister of claim 1 further characterized in that
   said first electrical item is a Superconducting Quantum Interference Device (SQUID) constructed in thin film technology as an annulus ring of small circumference; and
   said second electrical item is a toroidally wound wire circular coil of circumference large relative to said small circumference of said Superconducting Quantum Interference Device;
   whereby the areas of said coupling cavity of conical shape at any distance, including a small distance, from said SQUID are minimized in comparison to a coupling cavity of non-conical geometry;
   whereby under the physical law of inductance for cylindrical symmetry that $$L = \frac{\mu_o}{2\pi} \int \frac{dA}{r}$$

the stray inductance L contributed by the area dA at distance r of said electromagnetically inductive coupling cavity of conical shape is minimized in comparison to a coupling cavity of non-conical geometry;
   whereby under the physical law of noise energy per hertz that $$\epsilon \simeq 8kT \sqrt{\pi LC} ,$$

said minimized stray inductance L resultant from said electromagenetically inductive coupling cavity of conical shape does mean that the noise output of said SQUID is minimized by said coupling cavity of conical shape in comparison to a coupling cavity of non-conical geometry.

3. The superconducting canister of claim 2 further characterized in that
   the dielectric-filled coupling cavity of conical shape within said superconducting canister electromagnetically inductively couples said SQUID of said second electrical item; and
   said second electrical item is a toroidally wound wire circular coil of circumference large relative to said small circumference of said Superconducting Quantum Interference Device, plus at least one additional toroidally wound wire circular coil of identically large circumference, both of which circular coils are coaxial on the circular axis of the toroid, and both of which coaxial circular toroidally wound coils occupy one within the other the same physical cavity of toroidal shape within said superconducting canister.

4. The superconducting canister of claim 2 further characterized in that
   the dielectric-filled coupling cavity of conical shape within said superconducting canister electromagnetically inductively couples said SQUID to said toroidally wound wire circular first coil within a physical cavity of toroidal shape within said superconducting canister, which toroidally wound wire circular coil is in further electromagnetically inductive communication through a second coupling cavity with a toroidally wound wire circular second coil within a second physical cavity of toroidal shape within said superconducting canister wherein said first coil within said first physical cavity and said second coil within said second physical cavity are line-of-sight interconected by said second coupling cavity, line-of-sight interconnected meaning that at least some point upon said wound wire circular first coil is interconectable by a straight line proceeding entirely within and through said second coupling cavity to some point upon said wound wire circular second coil.

5. The superconducting canister of claim 2 further characterized in that
   the dielectric-filled coupling cavity of conical shape within said superconducting canister electromagnetically inductively couples said SQUID to said toroidally wound wire circular first coil within a physical cavity of toroidal shape within said superconducting canister, which toroidally wound wire circular coil is in further electromagnetically inductive communication through a second coupling cavity with a toroidally wound wire circular second coil within a second physical cavity of toroidal shape within said superconducting canister WHEREIN said first coil within said first physical cavity and said second coil within said second physical cavity are not line-of-sight interconnected by said second coupling cavity, not line-of-sight interconnected meaning that there exists no straight line entirely within and through said second coupling cavity by which any point upon said wound wire circular first coil is interconnectable to any point upon said wound wire circular second coil.

* * * * *